United States Patent [19]

Ballingall

[11] Patent Number: 4,948,963

[45] Date of Patent: Aug. 14, 1990

[54] THERMAL DETECTOR

[75] Inventor: Ronald A. Ballingall, Ashton-under-Hill, England

[73] Assignee: The Secretary of State for Defence in Her Britannic Majesty's Government of the United Kingdom of Great Britain and Northern Ireland, London, United Kingdom

[21] Appl. No.: 453,374

[22] Filed: Dec. 27, 1989

Related U.S. Application Data

[63] Continuation of Ser. No. 214,879, Jul. 5, 1988, abandoned, which is a continuation of Ser. No. 29,388, Mar. 23, 1987, abandoned, which is a continuation of Ser. No. 650,263, Sep. 13, 1984, abandoned.

[30] Foreign Application Priority Data

Sep. 28, 1983 [GB] United Kingdom ............... 8325935

[51] Int. Cl.$^5$ .................................................. G01J 5/20
[52] U.S. Cl. ........................... 250/338.1; 250/338.4; 250/332
[58] Field of Search ............. 250/338 SE, 332, 370 G, 250/370 R, 338.4, 338.3, 338.1, 370.08, 370.01

[56] References Cited

U.S. PATENT DOCUMENTS

| | | | |
|---|---|---|---|
| 2,977,477 | 3/1961 | Rosi et al. | 250/338 SE |
| 3,891,993 | 6/1975 | Beneking | 250/370 |
| 4,142,925 | 3/1979 | King et al. | 250/332 |
| 4,224,520 | 9/1980 | Greene et al. | 250/338 SE |
| 4,242,706 | 12/1980 | McCormack et al. | 358/213 |
| 4,360,732 | 11/1982 | Chapman et al. | 250/332 |

FOREIGN PATENT DOCUMENTS

| | | |
|---|---|---|
| 0087514 | 12/1982 | European Pat. Off. |
| 2851250 | 6/1980 | Fed. Rep. of Germany |
| 57-206838 | 12/1982 | Japan .................. 250/338 SE |
| 58-131525 | 8/1983 | Japan .................. 250/338 SE |
| 1395034 | 5/1975 | United Kingdom |
| 1568958 | 6/1980 | United Kingdom |

OTHER PUBLICATIONS

Lynch et al., "Optical Transducer" (250/338 SE) IBM Tech. Discl. Bull. vol. 12, No. 6, (Nov.-69) p.875.
Thom et al., "InSb CCDs & Other MIs Devices ..." 1975 Intern. Conf. on the Appli. of CCDS San Diego, Calif. Oct./75.

*Primary Examiner*—Janice A. Howell
*Assistant Examiner*—Richard Hanig
*Attorney, Agent, or Firm*—Nixon & Vanderhye

[57] ABSTRACT

A thermal detector comprises a thin film diode transistor coated with infrared absorbent material, and mounted on a thermally insulating support such as silicon oxide, foam glass or foam plastics material. The support may be recessed to improve insulation. The detector may be an array of diodes or transistors, and the diodes may be LEDs. Addressing may be line-by-line or co-ordinate selection. A transistor detector array may be arranged for signal integration and sample switching. A chopper may be used to modulate radiation illuminating the detector, whose output is fed to subtractive circuitry. Alternatively, a transistor detector array may incorporate additional transistors for bias current subtraction, each detecting transistor forming a long-tailed pair configuration with a respective additional transistor.

12 Claims, 3 Drawing Sheets

THERMAL DETECTOR

This is a continuation of application Ser. No. 214,879, filed July 5, 1988, which is a continuation of Ser. No. 029,388, filed Mar. 23, 1987, now abandoned, which is a continuation of Ser. No. 650,263, filed Sept. 13, 1984, now abandoned.

TECHNICAL FIELD

The invention relates to an infrared detector, and in particular to a thermal detector.

Infrared radiation absorbed by a thermal detector produces a rise in temperature of the detector material. The detector material is selected to have a temperature dependent property affected by temperature change, and this property is monitored to provide a signal indicating the infrared intensity illuminating the detector.

Thermal detectors are distinguishable from photodetectors, also referred to as photon detectors and also used for infrared detection. In a photon detector, radiation absorbed excites electronic transitions within the detector material producing a signal arising from the changed electronic energy distribution. Photoconductive and photovoltaic detectors operate in this way. For detection of infrared wavelengths longer than 3 μm, cooling is normally required to reduce thermally induced transitions so that photon-induced transitions predominate.

BACKGROUND ART

Pyroelectric materials are known for use as thermal detectors. The internal electrical polarisation of a pyroelectronic material changes rapidly with temperature in the region of its Curie temperature. Single-element pyroelectric detectors have been used as infrared detectors in burglar alarms, radiometers and the like. The pyroelectric material is arranged as a capacitor dielectric, and an electrical signal across the capacitor is monitored for changes arising from dielectric property variation with temperature affected by infrared absorption. Reticulated multi-element arrays of pyroelectric detectors are also known, in for example the pyroelectric vidicon tube. In this device the pyroelectric material is scanned with an electron beam to read out the varying surface charge pattern induced by infrared emission from a scene. The electrical current in the tube circuit is dependant on the polarisation charge on the detector surface at the point addressed by the electron beam.

A pyroelectric material for a thermal detector is selected to have its Curie temperature at about ambient temperature to permit operation without cooling. Sensitivity is a function of pyroelectric properties. Unfortunately, no improvement in performance can be obtained by cooling; performance can in fact worsen with cooling if the material is taken far from its Curie point. Compounds with suitable pyroelectric properties are comparatively expensive to make in the form of detector quality slices of pyroelectric material suitable for detector arrays. Moreover, the required signal read-out apparatus is complex. The pyroelectric vidicon tube for example requires a comparatively bulky vacuum tube containing an electron gun and an arrangement of beam deflection and current collection electrodes. The electron beam produces an undesirable degree of electrical noise.

Generally speaking, photon detectors are more sensitive than pyroelectric thermal detectors. However, for high sensitivity applications cooling to cryogenic temperatures (77° K.) is required, resulting in an undesirably bulky, complex and expensive arrangement. Simple thermoelectric cooling devices of acceptable power requirements are not adequate to give the necessary degree of cooling. Joule-Kelvin effect coolers are required. Photovoltaic devices such as photodiodes and Schottky photoemitters are known, these being usually operated at low and stable temperature. They accordingly normally consist of comparatively thick semiconductor material in intimate thermal contact with a heat sink and cooler. This minimizes and maintains constant unwanted thermally induced transitions.

DISCLOSURE OF THE INVENTION

It is an object of the present invention to provide a thermal detector capable of:
 (a) inexpensive production singly or in arrays,
 (b) comparatively simple read-out, and
 (c) operation at ambient temperature or with increased sensitivity at low temperature.

The present invention provides a thermal detector including:
 (1) a sensing element comprising a semiconductor device of thin film construction having at least one pn junction,
 (2) a thin layer of infrared absorptive material in intimate thermal contact with the sensing element, and
 (3) a sensing element support of low thermal conductance.

The detector of the invention is capable of inexpensive production since thin film semiconductor devices can be made singly or in arrays by known thin film technology, and this applies also to the associated infrared absorptive material. Provision of the support presents no difficulty. The detector of the invention is operative at ambient temperature, or at low temperature if increased sensitivity is required. The cooling requirements are less than those necessary for photon detectors, a simple thermoelectric cooler normally sufficing. As will be described later in more detail, signal read-out is comparatively simple compared to read-out from pyroelectric devices.

In view both of the thin film construction of the sensing element and associated absorptive material, and of the thermal isolation provided by the low conductance support, the element and absorptive material have low thermal capacity and rapidly follow temperature changes in a scene.

The sensing element may be a bipolar transistor or a junction diode. The diode may be of the light emitting (LED) variety. In the case of a transistor, the sensing element may also act as a preamplifier and read-out device in addition to storage properties arising from the thermal time constant. The preamplifier function arises from normal transistor properties, and read-out may be provided for by employing means for pulsing the transistor base voltage appropriately. Alternatively, the transistor may be supplemented by a switching transistor inserted in its emitter-collector circuit. To further advantage, the transistor may be combined with a shielded dummy transistor in a long-tailed pair configuration affording adaptive threshold subtraction. An LED provides light output which is a function of temperature. The light output may be monitored by any conventional means.

In a preferred embodiment of the invention, the sensing element has a thickness less than 10 μm and is formed of semiconductor material having a band gap greater than 1 eV, e.g. Si, GaAs, GaAlAs or GaP. In addition, the sensing element has a thermal conductance less than 0.4 W/K cm². The support may be of silicon oxide foam glass or foam plastics material. Thermal conduction between the sensing element and the support may be inhibited by partly relieving the support surface. In a further embodiment, there is provided an array of detectors each in accordance with the invention hereinbefore disclosed. The array preferably includes a plurality of sensing elements of reticulated thin film construction.

BRIEF INTRODUCTION OF THE DRAWINGS

In the drawings that accompany this specification:

Figure 1:
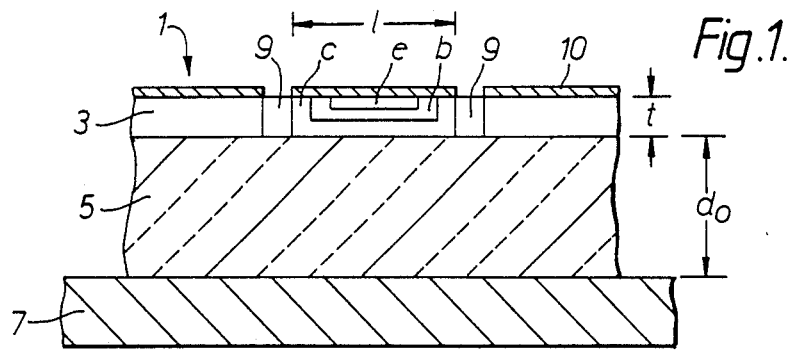
FIG. 1 is a cross-section showing the structure of a single element thermal detector, an embodiment of this invention.
Figure 4:
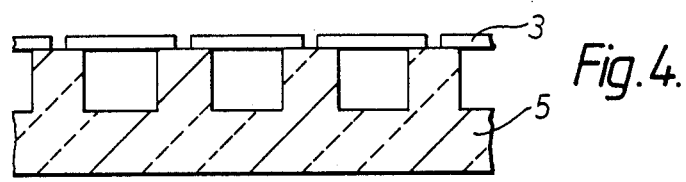
Figure 5:
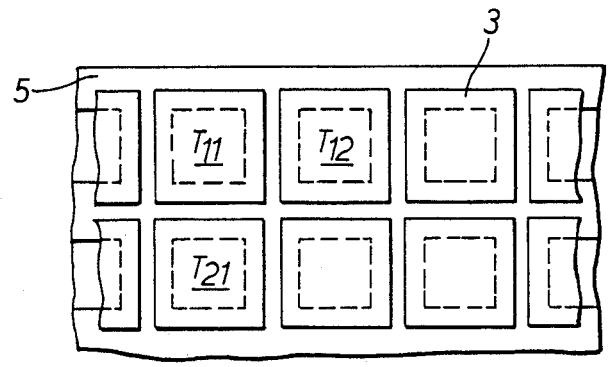
Figure 6:
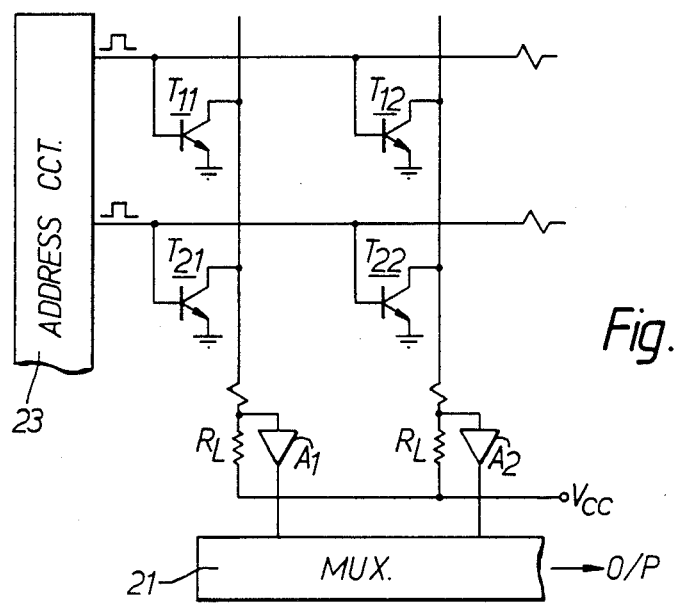

FIGS. 3(a)–(d) are cross-sections showing various stages in the manufacture of the detector of FIG. 1 above;

FIGS. 4 and 5 shown in cross-section and plan-view the structure of a multi-element array thermal detector, also an embodiment of this invention;

FIG. 6 is a circuit diagram for the array detectors of FIGS. 4 and 5 above; and

Figure 2:
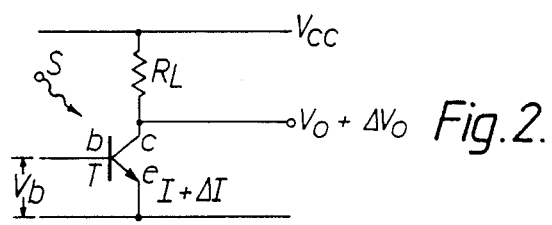
FIG. 2 is a circuit diagram for the detector of FIG. 1 above.
Figure 7:
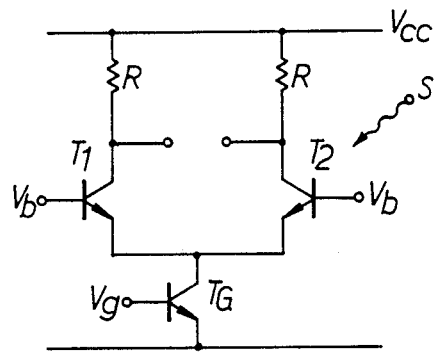
Figure 8:
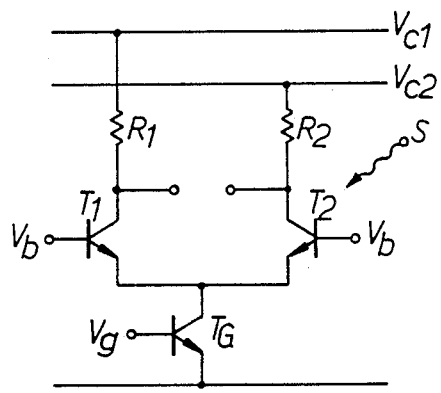

FIGS. 7 and 8 are circuit diagrams of alternative long-tail pair transistors that may be substituted for the single transistors shown in FIGS. 2 and 6 above.

DESCRIPTION OF PREFERRED EMBODIMENTS

Below are given expressions describing the performance characteristics derived for a simple thermally insulated diffusion limited bipolar transistor, a thin film sensing element mounted upon a low thermal conductance support. Similar considerations also apply to the performance characteristics of a junction diode, whether a homojunction or heterojunction device.

In a diffusion limited bipolar transistor the current-voltage (I-V) characteristics for the emitter-base junction are of the form:

$$I = I_o(T) \cdot \left[ \exp\left(\frac{q \cdot V_b}{k_B T}\right) - 1 \right];$$

where:

$V_b$ (volts) is the emitter-base voltage;
$T^T$ (K) is the absolute temperature of the junction;
q (Coulomb) is the electron charge constant;
$k_B$ (J.K$^{-1}$) is the Boltzman constant; and
$I_O$ (T) is a current parameter strongly dependent upon temperature.

At temperatures above the intrinsic temperature characteristic of the material, this expression reduces to $$I = \text{const.} \exp\left(\frac{q \cdot V_b - Eg}{k_B T}\right); \quad \text{E.1}$$

where Eg (electron-volts) is the energy band-gap of the transistor material.

The responsivity $R_{I\lambda}$ of the transistor detector, i.e. the rms signal current ΔI per unit rms radiant power ΔP upon the detector is thus given by the following expression:

$$R_{I\lambda} = \frac{dI}{dP} = \frac{dI}{dT} \cdot \frac{dT}{dP} = \frac{1}{G} \cdot \frac{dI}{dT}; \quad \text{E.2}$$

$$R_{I\lambda} = \frac{(qV_b - Eg)}{kT^2 G} I \ldots \text{(Amps/Watt)}$$

where G (Watt/K) is the thermal conductance of the detector.

In deriving an expression for the detector conductance G, the contribution of the thin film transistor (which is of higher conductivity material than that of the supporting mounting) can be ignored to a first approximation:

$$G = \left[ \left(\frac{k_T A}{d}\right)^2 + (2\pi F \rho_s A d)^2 \right]^{\frac{1}{2}}; \quad \text{E.3}$$

where:

A (cm²) is the area of the transistor element in contact with the supporting mounting;
d (cm) thickness of the mounting;
$k_T$ (Watt/cm.K) is the thermal conductivity of the mounting;
$\rho_s$ (J/cm³K) is the volume specific heat of the mounting; and,
F (Hz) is a sampling frequency.

The optimum thickness $d_o$ of the support is given when the two terms of the conductance are equal, and the conductance is therefore a minimum $$d_o = \left(\frac{k_T}{2\pi F \rho s}\right)^{\frac{1}{2}}; G_{min} = \sqrt{2}\left(\frac{k_T A}{d_o}\right) \quad \text{E.4}$$

The detectivity of this device will now be derived:
The minimum detector power (noise equivalent $P_{Nd}$ is given by:

$$P_{Nd} = (4 k_B T^2 G)^{\frac{1}{2}} \quad \text{E.5}$$

The current noise $i_{na}$ of the transistor must also be considered:

$$i_{na} = (2qI)^{\frac{1}{2}} \ldots \text{Amp/Hz}^{-\frac{1}{2}}$$

and the corresponding noise power $P_{Na}$:
$$P_{Na} = (2qI)^{\frac{1}{2}}/R_{I\lambda} \quad \text{E.6}$$

For a transistor of sensible construction, the contribution of partition (1/f) noise may be ignored to first approximation, the total noise equivalent power $P_N$ is thus given by the rms summation:
$$P_N = [P_{Nd}^2 + P_{Na}^2]^{\frac{1}{2}} \quad \text{E.7}$$

Thus the normalised detectivity D* defined as:

$$D^* = \frac{A^{\frac{1}{2}}}{P_N}$$

is given by:

$$D^* = \frac{R_{I\lambda} \cdot A^{\frac{1}{2}}}{[R_{I\lambda}^2 (4kT^2G) + 2qI]^{\frac{1}{2}}} \quad \text{E.8}$$

In the high current limit, where the detector noise is dominant, i.e.:

$$I > \frac{k_T k_B T^2 qA}{2d_o(qV_b - Eg)^2}$$

this expression for the normalised detectivity reduces to:

$$D^* = \frac{A^{\frac{1}{2}}}{[4k_B T^2 G]^{\frac{1}{2}}} \quad \text{E.8(A)}$$

$$= \frac{d_o^{\frac{1}{2}}}{[4k_T k_B T^2]^{\frac{1}{2}}} \quad \text{E.8(B)}$$

In general it can be said of the device that the responsivity is optimal at high current, low temperature, and with minimal support conductance. The detectivity is optimal for low temperature and with minimal support conductivity.

Examples are now given:

EXAMPLE 1

A thin film silicon transistor 50 μm square, supported on a solid layer support of silicon oxide of optimal thickness and maintained in an enclosure held at room temperature (300 K.):

$Eg=1.12$ eV; $k_T=0.014$ W/cm.K.; $\rho_s=0.03$ J/cm$^3$K; $d_o=63$ μm

Operating with a gate volta $V_b=0.687$ volts, a standing collector current I of 10 Amp and sampling frequency of 25 Hz:

$(qV_b - Eg)/K_b$ = $-5020$ (as calculated)
= $-4410$ (as measured).
$\frac{dI}{dT}/300$ = $-0.8$ μA/K at junction.

Taking radiant power density as $2 \times 10^{-4}$ Watt/cm.K over 8–12 μm wavelength IR band:

$\Delta T_{junction}$ $10^{-4}$ K/K temperature change $\Delta T'$ in thermal scene.

$\frac{dI}{dT}/300 \simeq$ 0.1 nanoamp/$K$ change in temperature of the thermal scene.

$D^*_{300}=1.5 \times 10^8$ cmHz$^{\frac{1}{2}}$Watt$^{-1}$

This may be compared to the detectivity pertaining in the case of ideal thermal isolation and where heat transfer is by radiation only, this representing the theoretical limit:

$D_R^*=(16 \sigma k_B T^5)^{-\frac{1}{2}}=1.8 \times 10^{10}$ cmHz$^{\frac{1}{2}}$Watt$^{-1}$.

EXAMPLE 2

As in example 1, but at reduced temperature (77 K.)

$Eg=1.15$ eV $V_b=1.017$ v.

Evaluation of the above expressions gives:

$(qV_b - Eg)/kT$ = $-1486$ (as calculated)
= $-1360$ (as measured)
$\frac{dI}{dT}/77$ = $-2.4$ mAmp/K $D^*_{77}=2.3 \times 10^9$ W cm$^{-1}$

EXAMPLE 3

A thin film silicon transistor 50 μm square, supported on a solid layer support of foam glass.

$k_T=300$ μW/cm.K; $\rho_s=600$ μWatt/cm.K; $d_o=63$ μm.

Evaluation of the above expressions gives:

$\Delta T/\Delta T' \simeq 5 \times 10^{-3}$ K/K $\frac{dI}{dT}/300$ = nanoamp/$K$.

$D^*_{300} = 7 \times 10^9$ cmHz$^{\frac{1}{2}}$Watt$^{-1}$

It is noted that yet further improvement in detectivity is attainable by reducing the support conductance—e.g. by etching away part of the support surface underlying the transistor. Further improvement in responsivity is also attainable, for example, by using in place of silicon a material of higher energy band-gap—e.g. gallium arsenide (Eg=1.4 eV @ 300 K.) for which the intrinsic carrier concentration varies more rapidly with temperature.

Further embodiments of the invention will now be described, by way of example only, with reference to the drawings accompanying the specification.

A single element detector 1 is shown in cross-section in FIG. 1 and the equivalent circuit, a conventional common-emitter transistor circuit, is shown in FIG. 2. The detector 1 is comprised of a thin monocrystalline film 3 of n-type silicon material, bonded to the surface of a low thermal conductance substrate 5 of silicon oxide. The thicknesses t and $d_o$ respectively, of the film and the substrate, are approximately 2 μm and $-60$ μm. The substrate 5 is bonded to the surface of a high thermal capacity metal shield 7, which during operational conditions is maintained at a constant temperature. P- and N-type diffusions have been introduced in the silicon film 3, to define the emitter e, base b, and collector c regions, of an n-p-n transistor structure T and resistive contact leads, for example tracks of polysilicon (not shown) have also been provided. Part of the silicon film 3 has been recessed 9 by photolith etch definition to delineate the area of the transistor sensor T and to minimise lateral thermal diffusion. The sensor T is square of side 1 of dimension 2 mm and serves thus as a large area detector. A thin low thermal conductance infrared absorptive layer 10 of e.g. graphite or a metal dispersion—gold-black or the like, is formed over the surface of the sensor T.

The collector voltage and base voltage supply lines $V_{cc}$, $V_b$ are shown in FIG. 2, as also a load resistor $R_L$ between the collector c and the collector voltage line $V_{cc}$. Preamplifier transistors may be formed in the silicon film 3 at the periphery of the sensor T.

Figure 3:
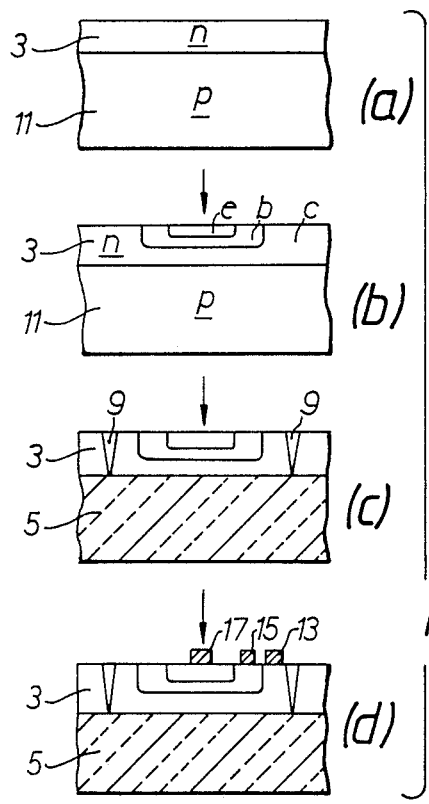

FIG. 3 serves to illustrate the process steps adopted during the manufacture of the detector 1 just described. In the first stage of this process (see FIG. 3(a)) a thin film epitaxial layer 3 of n-type silicon is grown upon the clean planar surface of a good quality monocrystalline substrate 11 of p-type silicon. This latter is of conventional thickness ~200 µm. P- and N-type diffusions are then formed to define the transistor structure. At this stage all other peripheral transistor structures may also be defined (see FIG. 3(b)). Following this stage, the substrate 11 is removed by means of a p-n selective etchant, and the film 3 bonded upon the low conductance substrate 5 which may be of silicon oxide, foam glass or foam plastics material of appropriate optimal thickness. The film 3 is then reticulated 9, following photolith pattern definition, using an appropriate etchant (see FIG. 3(c)). An inter-connect pattern of polysilicon resistive leads 13, 15 and 17 together with contact pads at the detector periphery are then defined (see FIG. 3(d)), and absorbtive material deposited. It will be understood, that given appropriate low conductance substrate material and process temperatures, the order of the steps recited above may be rearranged as is convenient.

It is also possible to construct multi-element array detectors employing the technical process above described. A typical example of such an array detector is shown in cross-section and plan in FIGS. 4 & 5. As shown, the silicon film 3 is mounted upon an etched low conductance substrate 5, the latter having been etched to form a support structure with no more than minimal thermal contact with the film, enough to provide adequate mechanical support. The film 3 has been reticulated and transistor structures $T_{11}$, $T_{12}$ . . . have been formed in row and column two-dimensional array. Each transistor sensor $T_{11}$, . . . $T_{nm}$ is of size 50 µm square.

The operational circuit for this array detector is shown in FIG. 6. The interconnection pattern is such that for each row of transistors e.g. $T_{11}$, $T_{12}$, . . . $T_{1m}$ the base contacts b are connected to a corresponding common row address line. For each column of transistors e.g. $T_{12}$, $T^{22}$, . . . $T_{n2}$ the collector contacts c are connected to a corresponding common column output line, one end of which is connected to the collector volta $V_{cc}$ supply line via an active resistive load $R_L$. Each column output line is tapped above the resistive load $R_L$ to provide connection to a corresponding one of a number of preamplifiers $A_1$, $A_2$, . . . , $A_m$. The output of each amplifier is connected to a multiplexer 21 and a line signal is provided at output O/P. Each row of transistors is pulsed once each frame. A typical frame interval being 40 msec (i.e. sample freq. f=25 Hz). The switch pulses are fed from an address circuit 23, for example a shift register. In this arrangement each transistor $T_{11}$ to $T_{nm}$ thus serves not only as a sensor of thermal radiation, but as an integrating store between each pulse, and, as a switch on each pulse.

In a modification of the above array circuit for each transistor $T_{11}$ to $T_{nm}$ an additional transistor could be inserted between collector and output line and connected at its base to the corresponding address line. The base b of each sensing transistor is then instead connected to a common gate voltage line. The signal current is then drawn by switching on collector voltage for the sensing transistors rather than using the sensing transistor as its own switch. Alternatively, both base and collector could be addressed to allow co-ordinate selection.

Standing current bias in the measured signal may be removed by using a chopper to interrupt the radiation falling upon the array and subtracting alternate frame signals. An alternative approach is to employ matched, paired, transistors e.g. $T_1$, $T^2$ in long-tail pair configuration as shown in FIG. 7. One transistor $T_1$ is masked from the thermal radiation, a reflecting metal shield being mounted over the transistor. Each transistor is referred to a common base voltage and switching is performed by an additional transistor $T_G$ interposed in the emitter circuit. A similar circuit is shown in FIG. 8, but here each transistor $T_1$ and $T_2$ is referred to a different collector voltage line $V_{c1}$, $V_{c2}$ via different resistive loads $R_1$, $R_2$. In this arrangement, the dummy transistor $T_1$ may be of significantly smaller geometry and designed to occupy significantly less space in the detector plane. This then allows a greater packing density in sensing elements with consequent improvement in spatial resolution.

The transistor circuits used for line and co-ordinate address above could be arranged in common base or common collector configuration. Active feedback could also be introduced. It will be appreciated that the array address that may be used is not restricted to the direct address schemes as described above.

The examples of the invention hereinbefore described of transistor sensing elements provide the advantages that the sensing element may act as its own preamplifier, read-out device or switch, and integrating store, as previously indicated. The preamplifier function arises from the transistor property of amplification and impedance conversion, and the storage function from thermal time constant effects common to all thermal detectors. In applications for which preamplification or read-out is not required to be incorporated in the sensing element, the sensing element may be a pn junction diode produced singly or in arrays. The current-voltage or I–V characteristics of a pn junction vary with temperature (and thus infrared radiation received from a scene) as follows from E.2:

$$\frac{dI}{dT} = GR_{I\lambda} = \frac{(qV_b - Eg)I}{KT^2} \qquad \text{E.9}$$

Monitoring the current in the diode when biassed accordingly provides a measure of the infrared radiation received by the diode.

The diode or diode array is produced similarly to the transistor embodiments, i.e. in thin film form with an associated infrared absorption layer and low conductance support. Since only two leads are required per diode, thermal conduction along leads to each diode is less than for a transistor; only one per junction is required, so the device is thinner with lower thermal capacity.

If the diode is of the light-emitting variety (LED), the intensity of the LED light emission is a function of temperature. A thin film (~2 μm) pn junction LED thermally isolated as previously described for transistors will change in temperature in accordance with the intensity of infrared radiation it receives. The temperature change produces a corresponding change in the LED operating point in its I-V characteristic. Necessarily, an attendant change in the LED emission intensity occurs which may be monitored by conventional means. Group III-V semiconductor LEDs incorporating Ga emit light in the visible or near infrared, since their band gaps are above 1 eV. Detection of their light emission with adequate sensitivity is a much simpler problem than detecting infrared light of wavelength 3 μm or longer. Furthermore, materials such as GaAs and GaP used for LEDs have wider band gaps than Si, and this enhances responsivity (see E.2).

A planar reticulated array of LEDs of similar construction to earlier embodiments of the invention may be employed as a detector. One side of the array receives infrared radiation from a scene, and light is emitted from the reverse side. A change-coupled device (CCD) camera of known kind may be employed to monitor light emission and provide an electrical output. Optical outputs from individual diodes of the detector array appear in parallel—i.e. simultaneously. The diode output is optically coupled to monitoring means, so there is no requirement for output connection leads which increase thermal conduction and worsen thermal isolation of the detector. The diodes may be pulsed for operation at high current levels to increase responsibility. From E.2, $R_{f\lambda} \propto I$, so that high pulsed current but low average current produces high responsivity without an unacceptable degree of diode heating.

I claim:

1. A thermal detector comprising a sensing element and a sensing element supporting means, said sensing element comprising:
   a thin layer of infrared absorptive material;
   a semiconductor device, overlaid by and in intimate thermal contact with said thin layer of infrared absorptive material, said semiconductor device comprising at least one thin film transistor;
   biassing and addressing means, connected to said transistor, for providing amplification of any signal at said semiconductor device;
   said sensing element supporting means comprising a material having a low thermal conductance of less than 0.4 Watt/K cm$^2$; and
   means for inhibiting thermal conduction in directions normal to said thin film transistor film thickness.

2. A thermal detector according to claim 1, wherein said sensing element has a total thickness less than 10 μm and the semiconductor device comprises a material having a band gap greater than 1 eV.

3. A thermal detector according to claim 2, wherein the supporting means is of silicon oxide material.

4. A thermal detector according to claim 2, wherein the supporting means is of foam glass or foam plastics material.

5. A thermal detector according to claim 1, wherein the supporting means is recessed to reduce thermal conduction between it and the sensing element.

6. A thermal detector in accordance with claim 1, comprising a plurality of sensing elements, wherein said plurality of sensing elements comprise a detector array, said array including interelement separating means for inhibiting thermal conduction between semiconductor devices of individual sensing elements.

7. A thermal detector according to claim 6, wherein said transistors of said array are arranged in rows and columns, and said detector further includes a plurality of address lines, each address line connected to a respective transistor base in a respective row and a plurality of output lines each connected to one of a transistor emitter and transistor collector, in a respective column.

8. A thermal detector according to claim 6, wherein each sensing element transistor includes a respective stitching transistor, a collector of one of said sensing element transistor and respective switching transistor being connected to the emitter of the other of said sensing element transistor and respective stitching transistor, said resultant pairs of transistors are arranged in an array of rows and columns, said detector further including respective address lines, connected to each stitching transistor base in a respective row, gate voltage lines are connected to sensing element transistor bases and respective output lines are connected to one of the emitter and collector of each sensing element transistor.

9. A thermal detector according to claim 1, further including:
   infrared radiation modulating means for modulating radiation illuminating said detector; and
   means for subtracting sensing element output signals for providing difference signals indicating changes in illuminating radiation intensity.

10. A thermal detector according to claim 1, wherein each of said transistors is paired with a radiation-shielded transistor in a long-tailed pair configuration.

11. A thermal detector according to claim 10, wherein each transistor of said long-tailed pair is associated with a respective collector voltage connection and resistive load.

12. A thermal detector including in combination:
   a sensing element comprising a semiconductor device of thin film construction having at least one pn junction, said sensing element being mounted on a low thermal conductance support arranged to isolate the semiconductor device thermally, a thin layer of low thermal conductance infrared absorptive material in intimate thermal contact with said semiconductor device and arranged to produce variation in device temperature in response to absorption of infrared radiation, and means for biasing said semiconductor device to provide an output signal responsive to radiation absorbed in said absorptive layer, wherein said sensing element is less than 10 μm in thickness, said support has a conductance less than 0.4 w/Kcm$^2$, and said semiconductor device is of material having a band gap greater than 1 eV.

* * * * *